United States Patent
Chen

(10) Patent No.: US 6,610,558 B2
(45) Date of Patent: Aug. 26, 2003

(54) METHOD FOR MOUNTING A SEMICONDUCTOR CHIP ON A SUBSTRATE AND SEMICONDUCTOR DEVICE ADAPTED FOR MOUNTING ON A SUBSTRATE

(75) Inventor: I-Ming Chen, Taipei (TW)

(73) Assignee: Computech International Ventures Limited, Tortola (VG)

( * ) Notice: Subject to any disclaimer, the term of this patent is extended or adjusted under 35 U.S.C. 154(b) by 0 days.

(21) Appl. No.: 10/125,179

(22) Filed: Apr. 17, 2002

(65) Prior Publication Data

US 2002/0113318 A1 Aug. 22, 2002

Related U.S. Application Data

(62) Division of application No. 09/688,855, filed on Oct. 16, 2000.

(30) Foreign Application Priority Data

Aug. 25, 2000 (TW) .......................................... 89117240 A

(51) Int. Cl.⁷ .......................... H01L 21/44; H01L 21/48; H01L 21/50
(52) U.S. Cl. ....................................... 438/106; 438/455

(58) Field of Search ............................... 438/26, 51, 55, 438/64, 106, 108, 455

(56) References Cited

U.S. PATENT DOCUMENTS

| | | |
|---|---|---|
| 5,535,101 A | 7/1996 | Miles et al. |
| 5,990,546 A | 11/1999 | Igarashi et al. |
| 6,143,991 A | 11/2000 | Moriyama |
| 6,187,615 B1 | 2/2001 | Kim et al. |
| 6,200,143 B1 | 3/2001 | Haba et al. |
| 6,239,488 B1 * | 5/2001 | Chen .......................... 257/737 |

* cited by examiner

Primary Examiner—Viet Q. Nguyen
Assistant Examiner—David Nhu

(57) ABSTRACT

A method for manufacturing a semiconductor device includes the steps of providing a semiconductor chip having a pad-mounting surface with a bonding pad, forming an insulative isolating layer on the pad-mounting surface, and forming a conductive body in the insulative isolating layer. The isolating layer has a contact receiving cavity, and an access hole for access to the contact receiving cavity. The access hole is narrower than the contact receiving cavity. The conductive body has an anchor portion filling the contact receiving cavity and the access hole and connecting electrically with the bonding pad.

16 Claims, 3 Drawing Sheets

METHOD FOR MOUNTING A SEMICONDUCTOR CHIP ON A SUBSTRATE AND SEMICONDUCTOR DEVICE ADAPTED FOR MOUNTING ON A SUBSTRATE

CROSS-REFERENCE TO RELATED APPLICATION

This application is a divisional of co-pending U.S. patent application Ser. No. 09/688,855, filed Oct. 16, 2000, the entire disclosure of which is incorporated herein by reference.

BACKGROUND OF THE INVENTION

1. Field of the Invention

This invention relates to a method for mounting a semiconductor chip on a substrate and to a semiconductor device that is adapted for mounting on a substrate.

2. Description of the Related Art

With the rapid advancement in semiconductor fabrication technology, the bonding pads on the surface of a semiconductor chip are getting smaller in size, and the distance between adjacent bonding pads are getting shorter. These can create difficulty when connecting the semiconductor chip to an external circuit, and can affect adversely the production yield.

SUMMARY OF THE INVENTION

Therefore, the main object of the present invention is to provide a method for mounting a semiconductor chip on a substrate so as to overcome the aforesaid drawback.

Another object of the present invention is to provide a semiconductor device adapted for mounting on a substrate and capable of overcoming the aforesaid drawback.

According to one aspect of the present invention, there is provided a method for mounting a semiconductor chip on a substrate having a chip-mounting region provided with a plurality of solder points. The semiconductor chip has a pad-mounting surface provided with a plurality of bonding pads, which are to be connected to corresponding ones of the solder points and which are disposed on the pad-mounting surface at locations that are offset from locations of the corresponding ones of the solder points on the chip-mounting region. The method comprises the steps of: forming pad-protecting bodies on the pad-mounting surface, each of which is made from an insulator material and covers at least a portion of a respective one of the bonding pads; forming a photoresist layer on the pad-mounting surface, wherein the pad-protecting bodies are embedded in the photoresist layer; forming access holes in the photoresist layer, each of which exposes a portion of a respective one of the pad-protecting bodies; removing the pad-protecting bodies from the pad-mounting surface via the access holes, thereby forming a plurality of contact receiving cavities in the photoresist layer at positions registered with the bonding pads on the pad-mounting surface; and forming a plurality of conductive bodies, each of which has an extension portion, and an anchor portion and a contact portion on opposite ends of the extension portion, the anchor portion filling a respective one of the contact receiving cavities and a respective one of the access holes and connecting electrically with a respective one of the bonding pads, the contact portion being formed on a surface of the photoresist layer opposite to the pad-mounting surface and being disposed at the location corresponding to a respective one of the solder points on the chip-mounting region of the substrate, the extension portion being formed on the surface of the photoresist layer and interconnecting the anchor and contact portions.

According to another aspect of the present invention, a semiconductor device is adapted for mounting on a substrate having a chip-mounting region provided with a plurality of solder points. The semiconductor device comprises: a semiconductor chip having a pad-mounting surface provided with a plurality of bonding pads which are disposed on the pad-mounting surface at locations that are offset from locations of corresponding ones of the solder points on the chip-mounting region; a photoresist layer formed on the pad-mounting surface of the semiconductor chip, the photoresist layer being formed with a plurality of contact receiving cavities adjacent to and registered with the bonding pads on the pad-mounting surface, and a plurality of access holes for access to the contact receiving cavities, the access holes being narrower than the contact receiving cavities; and a plurality of conductive bodies, each of which has an extension portion, and an anchor portion and a contact portion on opposite ends of the extension portion, the anchor portion filling a respective one of the contact receiving cavities and a respective one of the access holes and connecting electrically with a respective one of the bonding pads, the contact portion being formed on a surface of the photoresist layer opposite to the pad-mounting surface and being disposed at a location corresponding to that of a respective one of the solder points on the chip-mounting region of the substrate, the extension portion being formed on the surface of the photoresist layer and interconnecting the anchor and contact portions.

According to still another aspect of the present invention, there is provided a method for manufacturing a semiconductor device that comprises the steps of: providing a semiconductor chip having a pad-mounting surface with a bonding pad; forming an insulative isolating layer on the pad-mounting surface, the isolating layer having a contact receiving cavity that is adjacent to and registered with the bonding pad, and an access hole for access to the contact receiving cavity, the access hole being narrower than the contact receiving cavity; and forming a conductive body that has an anchor portion filling the contact receiving cavity and the access hole and connecting electrically with the bonding pad.

According to a further aspect of the present invention, a semiconductor device comprises: a semiconductor chip having a pad-mounting surface provided with a bonding pad; an insulative isolating layer formed on the pad-mounting surface, the isolating layer being formed with a contact receiving cavity that is adjacent to and registered with the bonding pad, and an access hole for access to the contact receiving cavity, the access hole being narrower than the contact receiving cavity; and a conductive body having an anchor portion that fills the contact receiving cavity and the access hole and that connects electrically with the bonding pad.

BRIEF DESCRIPTION OF THE DRAWINGS

In drawings which illustrate an embodiment of the invention.

DETAILED DESCRIPTION OF THE PREFERRED EMBODIMENT

Figure 1:
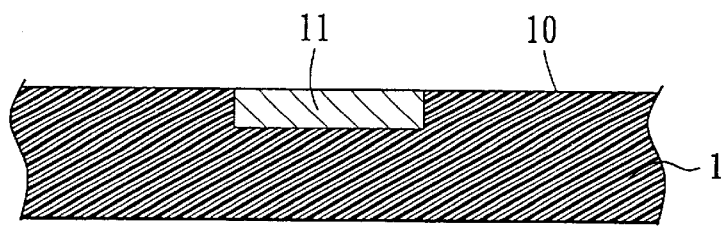
FIG. 1 is a schematic view illustrating a semiconductor chip to be mounted on a substrate according to a method of this invention.
Figure 7:
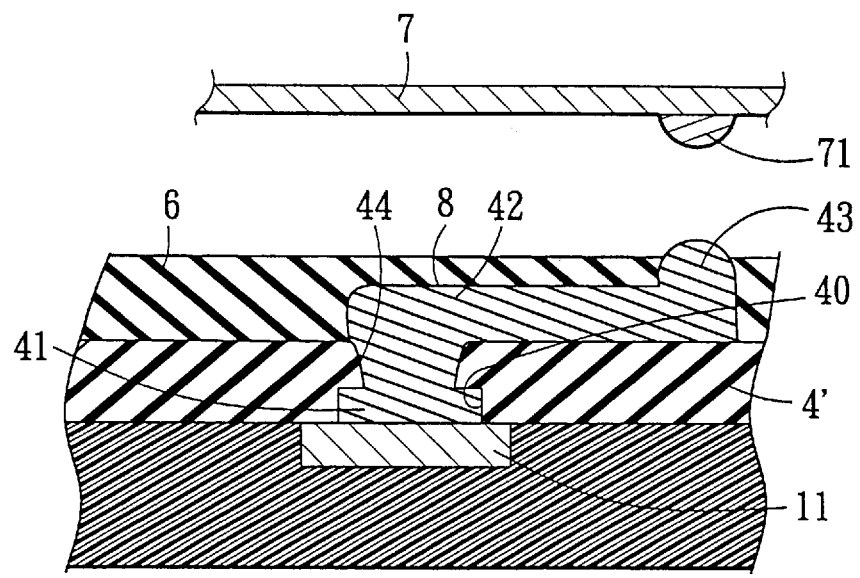
FIG. 7 is a schematic view to illustrate formation of a conductive body in the contact receiving cavity and an insulative protecting layer on the cured photoresist layer of FIG. 6.

FIG. 1 illustrates a semiconductor chip 1 to be mounted on a substrate 7 (see FIG. 7) according to the method of this invention. The substrate 7 has a chip-mounting region provided with a plurality of solder points 71 (only one solder point 71 is shown in FIG. 7). The semiconductor chip 1 has a pad-mounting surface 10 provided with a plurality of bonding pads 11 (only one bonding pad 11 is shown in FIG. 1), which are to be connected to corresponding ones of the solder points 71 and which are disposed on the pad-mounting surface 10 at locations that are offset from locations of the corresponding ones of the solder points 71 on the chip-mounting region of the substrate 7 (see FIG. 7).

FIGS. 2 to 7 illustrate consecutive steps of processing the semiconductor chip 1 for forming a semiconductor device that is to be mounted on the substrate 7 according to the method of this invention.

Figure 2:
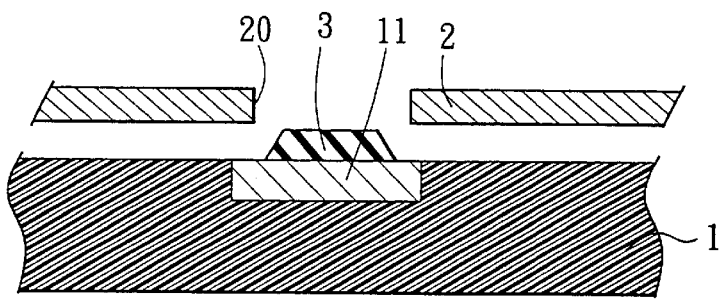
FIG. 2 is a schematic view illustrating a printing screen plate used in the method of this invention for forming a pad-protecting body on a bonding pad on a pad-mounting surface of the semiconductor chip of FIG. 1.

In FIG. 2, a steel plate 2 is used, and is superimposed on the pad-mounting surface 10 of the semiconductor chip 1. The steel plate 2 is a printing screen plate 2 in the embodiment of this invention, and is formed with a plurality of non-intersecting holes 20 (only one hole 20 is shown in FIG. 2) at positions registered with the bonding pads 11 of the semiconductor chip 1. A plurality of pad-protecting bodies 3 are formed on the pad-mounting surface 10 via a printing technique that uses an insulator material, such as gel-like resin or rosin, as printing material. Each pad-protecting body 3 covers at least a portion of a respective one of the bonding pads 11. The pad-protecting bodies 3 can be also formed via photolithography and etching process that includes steps of forming a photoresist layer on the pad-mounting surface 10, exposing the photoresist layer at positions registered with the bonding pads 11, and removing unexposed regions of the photoresist layer by solvent washing. Each pad-protecting body 3 has a cross-section that is gradually reduced in a direction away from the pad-mounting surface 10.

Figure 3:
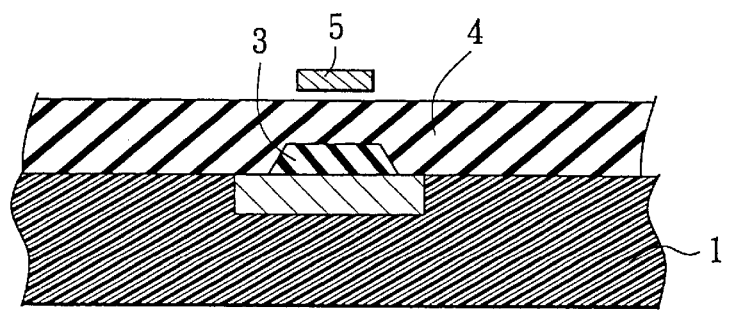
FIG. 3 is a schematic view illustrating a photoresist layer formed on the pad-mounting surface of the semiconductor chip of FIG. 1, and a mask used in the method of this invention.

In FIG. 3, a light-curable layer, such as a photoresist layer 4, is formed on the pad-mounting surface 10 such that the pad-protecting bodies 3 are embedded in the photoresist layer 4, and a mask 5 is superimposed on the phtoresist layer 4.

Figure 4:
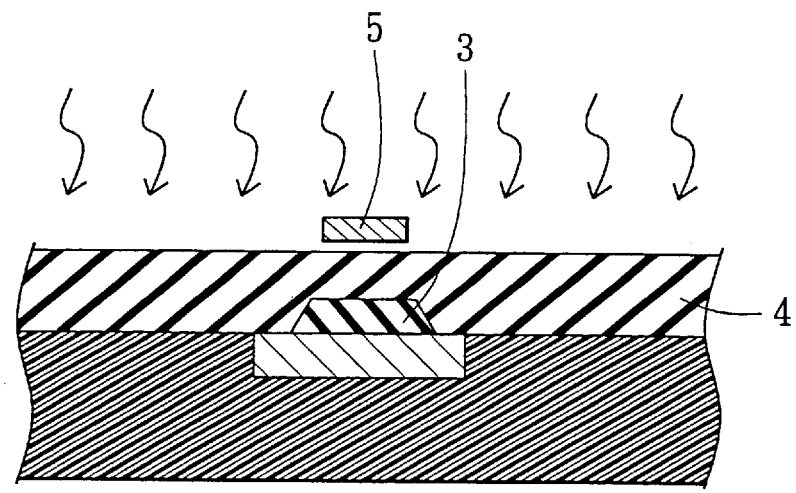
FIG. 4 is a schematic view to illustrate the photoresist layer of FIG. 3 undergoing a photolithography process according to the method of this invention.

In FIG. 4, the photoresist layer 4 is exposed at positions that are offset from the pad-protecting bodies 3. The exposed portion of the photoresist layer 4 hardens, and forms an insulative isolating layer 4' that covers the pad-mounting surface 10.

Figure 5:
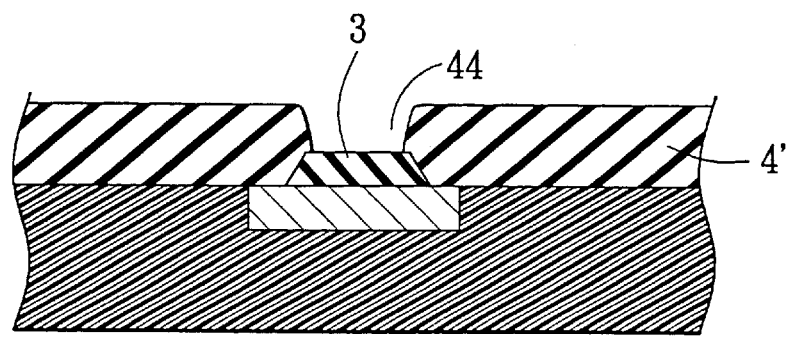
FIG. 5 is a schematic view illustrating an access hole formed in the cured photoresist layer of FIG. 4 according to the method of this invention.

In FIG. 5, a plurality of access holes 44 (only one is shown) are formed in the photoresist layer 4 by removing the unexposed portion of the photoresist layer 4' from the isolating layer 4' via solvent washing. Each of the access holes 44 exposes a portion of a respective one of the pad-protecting bodies 3.

Figure 6:
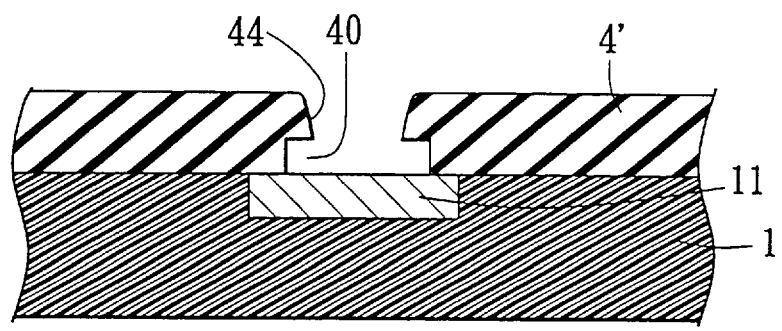
FIG. 6 is a schematic view to illustrate removal of the pad-protecting body to form a contact receiving cavity via a solvent washing process according to the method of this invention.

In FIG. 6, the pad-protecting bodies 3 are removed from the pad-mounting surface 3 by solvent washing via the access holes 44, thereby forming a plurality of contact receiving cavities 40 (only one is shown) in the isolating layer 4' at positions registered with the bonding pads 11 on the pad-mounting surface 10. Each contact receiving cavity 40 extends from a respective access hole 44, and has a width greater than that of the respective access hole 44. Preferably, the contact receiving cavity 40 and the respective access hole 44 form an inverted T-shaped cross-section.

In FIG. 7, a plurality of conductive bodies 8 (only one is shown) are formed respectively in the contact receiving cavities 40 and the access holes 44. Each of the conductive bodies 8 has an extension portion 42, and an anchor portion 41 and a contact portion 43 on opposite ends of the extension portion 42. The anchor portion 41 fills a respective one of the contact receiving cavities 40 and a respective one of the access holes 44, connects electrically with a respective one of the bonding pads 11, and has a cross-section conforming to the inverted T-shaped cross-section of the respective one of the contact receiving cavities 40 and the respective one of the access holes 44. The contact portion 43 is formed on a surface of the isolating layer 4 opposite to the pad-mounting surface 10, and is disposed at the location corresponding to a respective one of the solder points 71 on the chip-mounting region of the substrate 7. The extension portion 42 is formed on the surface of the isolating layer 4', and interconnects the anchor and contact portions 41, 43. The conductive bodies 8 are formed from conductive paste. An insulative protecting layer 6 can be formed on the isolating layer 4' to cover the anchor and extension portions 41, 42 of the conductive bodies 8.

With the design of the conductive bodies 8 according to the method of this invention, the difficulty encountered in the prior art can be abated, and the production yield can be significantly increased. Moreover, with the anchor portion 41 embedded in the isolating layer 4' and with the extension portion 42 embedded in the protecting layer 6, the anchor portion 41 of the conductive body 8 can be held firmly in contact with the bonding pad 11 without peeling off during the subsequent processing steps, such as thermal test.

With the invention thus explained, it is apparent that various modifications and variations can be made without departing from the spirit of the present invention. It is therefore intended that the invention be limited only as recited in the appended claims.

I claim:

1. A method for mounting a semiconductor chip on a substrate, the substrate having a chip-mounting region provided with a plurality of solder points, the semiconductor chip having a pad-mounting surface provided with a plurality of bonding pads, which are to be connected to corresponding ones of the solder points and which are disposed on the pad-mounting surface at locations that are offset from locations of the corresponding ones of the solder points on the chip-mounting region, said method comprising the steps of:

forming pad-protecting bodies on the pad-mounting surface, each of which is made from an insulator material and covers at least a portion of a respective one of the bonding pads;

forming a photoresist layer on the pad-mounting surface, wherein the pad-protecting bodies are embedded in the photoresist layer;

forming access holes in the photoresist layer, each of which exposes a portion of a respective one of the pad-protecting bodies;

removing the pad-protecting bodies from the pad-mounting surface via the access holes, thereby forming a plurality of contact receiving cavities in the photoresist layer at positions registered with the bonding pads on the pad-mounting surface; and forming a plurality of conductive bodies, each of which has an extension portion, and an anchor portion and a contact portion on opposite ends of the extension portion, the anchor portion filling a respective one of the contact receiving cavities and a respective one of the access holes and connecting electrically with a respective one of the bonding pads, the contact portion being formed on a surface of the photoresist layer opposite to the pad-mounting surface and being disposed at the location corresponding to a respective one of the solder points on the chip-mounting region of the substrate, the extension portion being formed on the surface of the photoresist layer and interconnecting the anchor and contact portions.

2. The method of claim 1, wherein the pad-protecting bodies are formed on the pad mounting surface by printing.

3. The method of claim 1, wherein each of the pad-protecting bodies has a cross-section that is gradually reduced in a direction away from the pad-mounting surface.

4. The method of claim 1, wherein the pad-protecting bodies are removed from the pad-mounting surface by solvent washing.

5. The method of claim 1, wherein the conductive bodies are formed from conductive paste.

6. The method of claim 1, further comprising the step of forming an insulative protecting layer on the photoresist layer to cover the anchor and extension portions of the conductive bodies.

7. A method for manufacturing a semiconductor device, comprising the steps of:

providing a semiconductor chip having a pad-mounting surface with a bonding pad;

forming an insulative isolating layer on the pad-mounting surface, the isolating layer having a contact receiving cavity that is adjacent to and registered with the bonding pad, and an access hole for access to the contact receiving cavity, the access hole being narrower than the contact receiving cavity; and forming a conductive body that has an anchor portion filling the contact receiving cavity and the access hole and connecting electrically with the bonding pad.

8. The method of claim 7, wherein the step of forming the isolating layer includes:

forming a pad-protecting body on the pad-mounting surface, the pad-protecting body being made from an insulator material and covering at least a portion of the bonding pad;

forming a light-curable layer on the pad-mounting surface such that the pad-protecting body is embedded in the light-curable layer;

subjecting the light-curable layer to a photolithography and etching process to thereby obtain the isolating layer having the access hole that exposes a portion of the pad-protecting body; and removing the pad-protecting body from the pad-mounting surface via the access hole to thereby form the isolating layer with the contact receiving cavity.

9. The method of claim 8, wherein the pad-protecting body is formed on the pad mounting surface by printing.

10. The method of claim 8, wherein the pad-protecting body has a cross-section that is gradually reduced in a direction away from the pad-mounting surface.

11. The method of claim 8, wherein the pad-protecting body is removed from the pad-mounting surface by solvent washing.

12. The method of claim 8, wherein the light-curable layer is a photoresist layer.

13. The method of claim 7, wherein the conductive body is formed from conductive paste.

14. The method of claim 7, wherein the conductive body further has an extension portion formed on a surface of the isolating layer opposite to the pad-mounting surface and connected at one end to the anchor portion.

15. The method of claim 14, wherein the conductive body further has a contact portion formed on the surface of the isolating layer at another end of the extension portion opposite to the anchor portion.

16. The method of claim 15, further comprising the step of forming an insulative protecting layer on the isolating layer to cover the anchor and extension portions of the conductive body.

* * * * *